United States Patent [19]

Gamand

[11] Patent Number: 4,985,642

[45] Date of Patent: Jan. 15, 1991

[54] HIGH-FREQUENCY CIRCUIT HAVING A LOADED FIELD-EFFECT TRANSISTOR

[75] Inventor: Patrice Gamand, Yerres, France

[73] Assignee: U.S. Philips Corp., New York, N.Y.

[21] Appl. No.: 284,205

[22] Filed: Dec. 14, 1988

[30] Foreign Application Priority Data

Dec. 18, 1987 [FR] France .................. 87 17712

[51] Int. Cl.$^5$ .................. H03K 3/353; H03B 5/18; H01L 29/80
[52] U.S. Cl. .................. 307/304; 307/491; 330/286; 330/277; 330/54; 357/41; 331/117 FE
[58] Field of Search .................. 307/304, 491, 271; 330/54, 277, 286, 296; 331/117 FE; 357/22, 15, 41

[56] References Cited

U.S. PATENT DOCUMENTS

| | | | |
|---|---|---|---|
| 4,011,518 | 3/1977 | Irvine et al. | 330/277 |
| 4,486,719 | 12/1984 | Ayasli | 330/286 |
| 4,783,849 | 11/1988 | Muterspaugh | 330/277 |
| 4,853,649 | 8/1989 | Seino et al. | 330/277 |

*Primary Examiner*—Timothy P. Callahan
*Attorney, Agent, or Firm*—Steven R. Biren

[57] ABSTRACT

A high-frequency circuit includes a field-effect transistor having a gate electrode for receiving a high-frequency input signal, a source electrode and a drain electrode. Substantial improvements in both maximum gain and high-frequency performance are achieved by providing an input or output terminal at one end of each electrode, and terminating at least one of the electrodes with an appropriate impedance at its second end.

9 Claims, 4 Drawing Sheets

HIGH-FREQUENCY CIRCUIT HAVING A LOADED FIELD-EFFECT TRANSISTOR

BACKGROUND OF THE INVENTION

The invention relates to a high-frequency circuit comprising at least a field-effect transistor comprised, in contact with an active zone, of gate, drain and source electrodes, the gate electrode receiving a high-frequency input signal and the source and drain electrodes being moreover provided with biasing and charging circuits, and the source electrode being connected to ground through a load.

The invention is used in amplifier stages or oscillators in high-frequency fields.

A high-frequency circuit of the type described above is known from the article "A fully-integrated, 0.5. W; 2 to 6 GHz MMIc amplifier", by B. MAOZ et al, during the "17th European Microwave Conference, Ergife Palace Hotel, Rome, Italy, 7th 11th Sept. 1987", published in "Conference Proceedings Microwave exhibitions and Publishers LTD, pp. 261-266".

This article discloses an integrated amplifier formed by two stages. Each stage comprises a field-effect transistor, with interleaved gate. The gate is consequently formed by a plurality of fingers which at one end are connected to a large-surface gate contact area, and to which the high-frequency input signal of the stage and also a biasing circuit of the LC type are applied. The drain is also formed by a plurality of fingers, which alternate with the gate fingers, which are connected, at their end opposite the gate contact area, to a large-surface drain pad, to which a biasing circuit of the LC type is applied and where the high-frequency output signal of the stage is picked off. The source is directly connected to ground.

Whatever its design, this amplifier provides, for each stage, a maximum gain which is less than or equal to the gain of a non-loaded transistor identical to the transistor forming it.

SUMMARY OF THE INVENTION

The present invention has for its main object to provide a circuit comprising at least one loaded field-effect transistor having a maximum gain which is higher than the gain of an identical non-loaded transistor. According to the invention, this object is achieved by means of a circuit of the type described above, characterized in that the high-frequency signals are applied to or are available at an end of their respective electrodes, these electrodes furthermore being terminated at their second end by their respective biasing or charging circuits.

The circuit according to the invention then provides for each loaded field-effect transistor stage a gain which is higher than the gain of a similar non-loaded transistor.

In addition, the circuit according to the invention can operate at very high frequencies, and over a very wide frequency band.

BRIEF DESCRIPTION OF THE DRAWING

The invention and how it operates will be better understood from the following description which is given by way of example with reference to the accompanying Figures, in which.

DESCRIPTION OF THE PREFERRED EMBODIMENTS

The loaded field-effect transistor of the invention can be used to provide amplifier stages, oscillator stages, mixers, voltage limiters, etc, for both low frequencies and high frequencies.

The characteristic features for changing from one type of circuit to another are known to a person skilled in the art and, basically, do not form part of the invention. For that reason only amplifier stages will be described here by way of example.

Figure 1A:
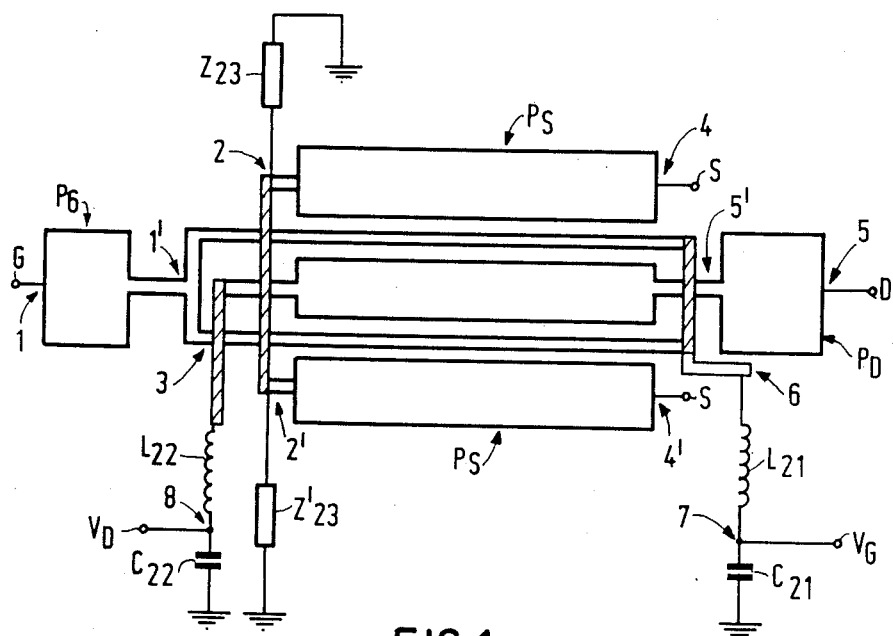
FIG. 1a is a plan view of an amplifier stage according to the invention, comprising a field-effect transistor having interdigital gate and drain electrodes.

As is shown in FIG. 1a, an amplifier stage provided in accordance with the invention, comprises a field-effect transistor. This transistor is formed by an active zone, for example of an n-conductivity type, provided on the surface of a semi-insulating substrate. This active zone is provided with a gate electrode G in the shape of two fingers which meet at an end 1' and are connected by means of this end to a large-surface pad $P_G$, and a drain electrode in the form of a finger which is disposed between the two gate fingers and via the end 5' opposite to the terminal area $P_G$ is connected to a large-surface pad $P_D$. The active zone is also provided with two source pads Ps, which are of an elongate shape and disposed on both sides of the gate fingers between the points 2 and 4, and between the points 2' and 4', respectively.

To realize such a transistor, useful particulars are described in the periodical "ACTA ELECTRONICA", vol. 23, 2, 1980, pp. 99–109; vol. 23, 1, 1980, p. 64; vol. 23, 2, 1980, pp. 116–117; vol. 23, 2, 1980, pp. 123–124; and for general information on gallium-arsenide field-effect transistors reference is made to the volume 23, 1980 of this periodical.

The gate fingers may, for example, be Shottky-type electrodes, and the source and drain may be electrodes of the ohmic type.

The performance of a field-effect transistor mainly depends on its gate width, denoted by L, and its gate length, denoted l.

However, in the above-mentioned high-frequency circuit, as in the amplifiers, the main characteristic of the circuit is its maximum available gain (M.A.G), and the main problem to be solved is how to obtain a highest possible gain, in the widest possible frequency band.

The gain of a field-effect transistor can be calculated from the parameters $S_{ij}$ which are the reflection coefficients at the inputs and outputs, or the transfer coefficients between the inputs and outputs of the transistor which is considered to be a quadripole. For this subject reference is made to "ACTA ELECTRONICA" vol. 23, 2, 1980, pp. 137-140.

A stability coefficient K of the quadripole, which is expressed in the relation 1 of the Table I is also defined.

If $K > 1$, the transistor is considered to be unconditionally stable; in the opposite case, wherein $K > 1$ the transistor is potentially unstable.

If $K > 1$, the maximum available gain (abbreviated to MAG) which is expressed in the relation of the Table I is defined, if not the maximum stable gain (abbreviated to MSG) which is expressed in the relation 3 of the Table I is defined.

Figure 1B:
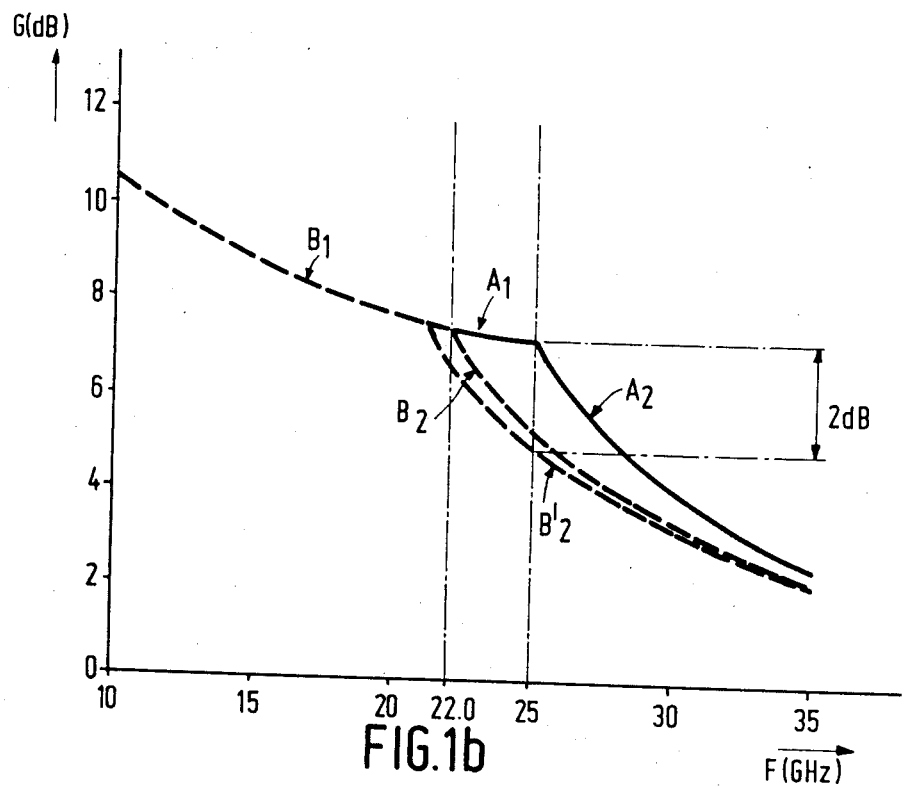
FIG. 1b illustrates, by means of a solid line, on the curve A, the maximum gain of the loaded transistor, in an embodiment of the stage of FIG. 1a, and by means of a broken line, on the curve B, the maximum gain of the same transistor in the non-loaded state, or charged in accordance with the prior art.

FIG. 1b shows, for the type of field-effect transistor represented in FIG. 1a, a development of the maximum gain G of the non-loaded transistor (curve B in broken lines), as a function of the frequency F.

The first portion of the curve B (denoted $B_1$) represents the portion wherein $K < 1$ (MSG) and the second portion represents the curve of the portion wherein $K > 1$ (MAG).

When an amplifier stage of the type as described in the state of the art "Conference Proceedings 1987 pp. 261-266", cited above, which amplifier stage comprises a field-effect transistor whose gate and drain, respectively, are biased via an inductance provided on the large-surface pad, this inductance furthermore being connected to ground via an isolating capacitor, it is found that the maximum available gain (MAG) is less than the gain of the non-loaded transistor, and that the maximum stable gain (MSG) is only equal thereto.

Therefore, if the curve of the maximum gain of the transistor of FIG. 1a is plotted on FIG. 1b, while applying to realize the biasing circuits the information contained in the above-cited document, an identical portion of the curve $B_1$ (the case in which $K < 1$ and MSG is identical) and a portion of the curve $B_2$ located below the curve $B_2$ already shown, and near to the axis bearing the frequencies (the case in which $K > 1$ and MAG lower than that of the non-loaded transistor) would be obtained.

The curves B of the FIG. 1b clearly show that the circuit disclosed in the cited document cannot provide a gain higher than the gain of an identical non-loaded transistor. In contradistinction thereto, the circuit according to the invention renders it possible to obtain a maximum gain of the amplifier stage higher than the maximum gain of the same transistor in the non-loaded state. In addition, the circuit according to the invention renders it possible to obtain such an increase in the gain in the field of very high frequencies generally higher than 20 or 22 GHz) and over a very wide frequency band. Finally, the circuit thus realized in accordance with the invention provides a better matching of the input and the output than the prior art circuit.

According to the invention, the MAG of the stage is increased by taking into account intrinsic characteristics of the gate (for this subject reference is made to ACTA ELECTRONICA vol. 23, 1, 1980, pp. 78-79), loaded by the inductance connected to its end opposite the gate terminal area. The object achieved by the circuit according to the invention is an increase in the reflection coefficient $S_1$ at the input of the circuit which is assumed to be a quadripole. The increase in $S_{11}$ causes a decrease of the stability coefficient K, this coefficient directly acting in the relation (2) of the Table I giving the gain MAG.

Defining $S_{21}$ as the transfer parameter from the input to the output of the quadripole, and $S_{12}$ as the transfer parameter from the output to the input, it appears in this relation (2) that: — at a constant ratio $S_{21}/S_{12}$, the decrease in the value of K causes the value of MAG to increase.

Now, when two differently loaded circuits are nevertheless realized from one identical transistor, the ratio $S_{21}/S_{12}$ remains identical for both these circuits. Thus, obtaining a decrease in K renders it possible to increase the MAG, and thus to obtain the curves $A_1$ and $A_2$ of the FIG. 1b.

The objects of the invention are achieved by means of the arrangement shown inter alia in FIG. 1a.

The high-frequency input signal I is applied to the point 1 on the gate pad $P_G$. The high-frequency output signal O is available in the point 5 on the drain pad $P_D$.

According to the invention, the ends 6 of the gate opposite to the pad $P_G$ to which the high-frequency input signal I is applied are no longer maintained in the open circuit state as in the prior art, and the end 3 of the drain opposite to the pad $P_D$ at which the high-frequency output signal is available is likewise not an open circuit, but, in contrast therewith they are terminated at inductive loads, in such manner as to compensate for the input-output capacitances of the transistor.

Acting thus, the resistive structure of the gate is used to provide the arrangement according to the invention, which has a MAG exceeding the MAG of an identical transistor which is not loaded or loaded in a known manner.

As is illustrated in FIG. 1a, the ends 6 of the two gate fingers are combined, for example via an interconnection realized at a second level, at the connection 5' which is established between the drain finger and the drain pad $P_D$. This end 6 is terminated at the inductance $L_{21}$, to whose other end, in the point 7, the d.c. biasing voltage $V_G$ is applied. In addition, in the point 7, the inductance $L_{21}$ is connected to ground across an isolating capacitor $C_{21}$.

The end 3 of the drain, opposite the pad $P_D$, is terminated, for example via an interconnection provided at a second level, at the inductance $L_{22}$, to the other end of which, in the point 8, a biasing d.c. voltage $V_D$ is applied. In addition, in the point 8, the inductance $L_{22}$ is connected to ground across an isolating capacitor $C_{22}$.

The structure of FIG. 1a renders it possible to apply the gate and drain biasing voltages directly, to have the arrangement function without other elements of the circuit being necessary.

The inductances $L_{21}$ and $L_{22}$ can be replaced for different uses by micro-strip lines or circuits comprising micro-strip lines associated with open or short circuited lines.

Finally, the ends 2 and 2' of the source pads $P_S$ are interconnected, for example via an interconnection at a second level, and are terminated on respective impedances $Z_{23}$ and $Z'_{23}$ disposed between the points 2 and 2', respectively and ground. It is advantageous for the loads $Z_{23}$ and $Z'_{23}$ to be equal, and in accordance with the relation (4) of the Table I. If $Y=0$, the impedance Z is purely resistive. If $Y<0$, the impedance Z comprises a capacitance and if $Y>0$, this impedance comprises an inductance. The high-frequency source signal can be taken either from the point 4 or from point 4', at ends opposite the source pads $P_S$.

The stage comprising a transistor having an interdigital gate and drain to which the biasing and load circuits are applied in accordance with the present invention constitutes a high-frequency wide-band amplifier.

In an embodiment, the stage according to the invention, as shown in FIG. 1a, is provided on an gallium-arsenide (GaAS) semi-insulating substrate. The active zone is of the n-type. The Table II shows values of elements for putting this amplifier stage into effect in this example.

With a stage formed from elements according to the Table II and having the structure of FIG. 1a, the gain shown in the curves $A_1$ and $A_2$ of FIG. 1b were obtained. Between 10 and 30 GHz an increase in the gain MAG by 2 dB to 25 GHz is found, which corresponds to an increase in the pass-bandwidth of approximately 3 GHz.

Figure 4A:
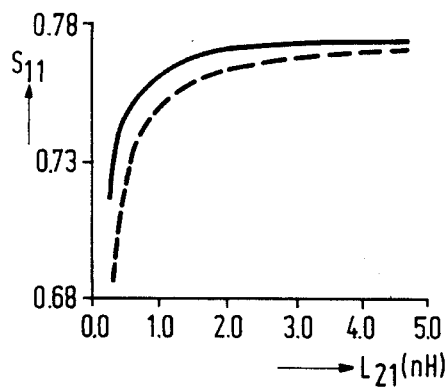
FIGS. 4a–4e illustrate the variations in the parameters $S_{11}$, K, $S_{12}$, $S_{21}$ and of MAG as a function of $L_{21}$, for a loaded transistor according to the invention (solid line) and for a non-loaded or loaded transistor in accordance with the prior art (broken line).
Figure 4B:
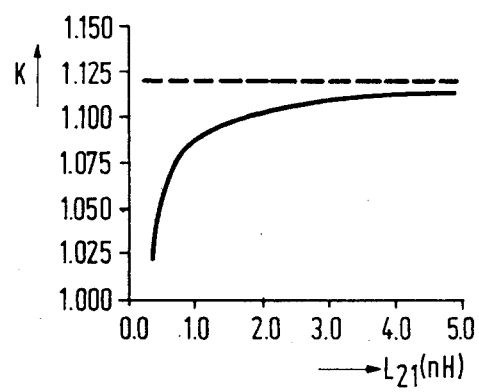
Figure 4C:
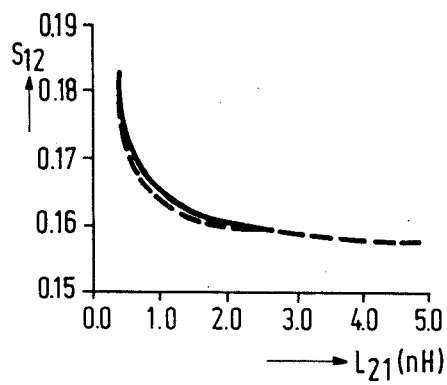
Figure 4D:
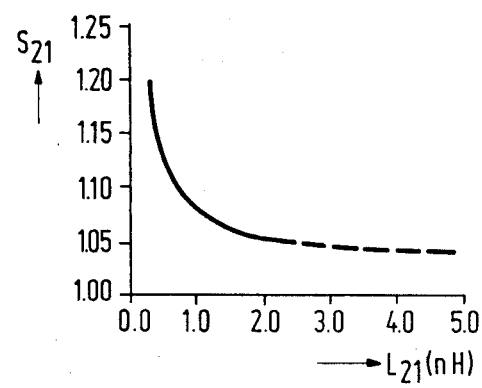
Figure 4E:
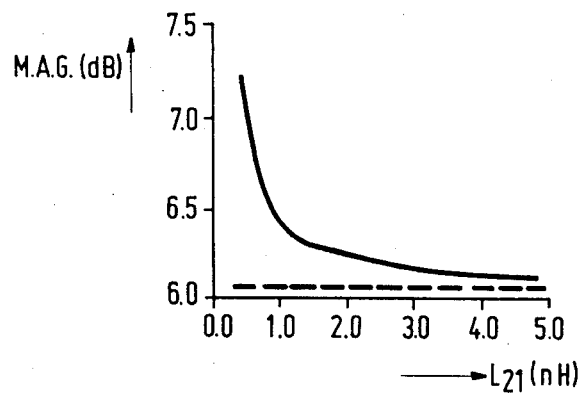

The set of FIGS. 4a–4e illustrate the development of the different parameters of a transistor when it is loaded in accordance with the invention (solid line curves) compared with the same parameters of a non-loaded transistor or a transistor loaded in accordance with the prior art (broken-line curves), at a frequency F=35 GHz. More specifically:

FIG. 4a shows the variations of the reflection coefficient $S_{11}$ as a function of the inductance values $L_{21}$;

FIG. 4b shows the variations in the stability coefficient K as a function of $L_{21}$;

FIGS. 4c and 4d show the variations of the transfer coneffficients $S_{12}$ and $S_{21}$ as a function of $L_{21}$;

FIG. 4a shows the variations of MAG as a function of $L_{21}$.

It should be noted that the stability coefficient of the arrangement according to the invention is somewhat lower than in the known arrangements, but that the coefficient remains well over 1. The circuit according to the invention therefore remains unconditionally stable.

The type of transistor which is suitable for use for the circuit according to the invention is not limited to the particular transistor shown in FIG. 1a.

It is possible to use in a general manner a transistor having N gate fingers between which (N−1) drain fingers are disposed. These interdigital structures are chosen for high-frequency operation.

Figure 2:
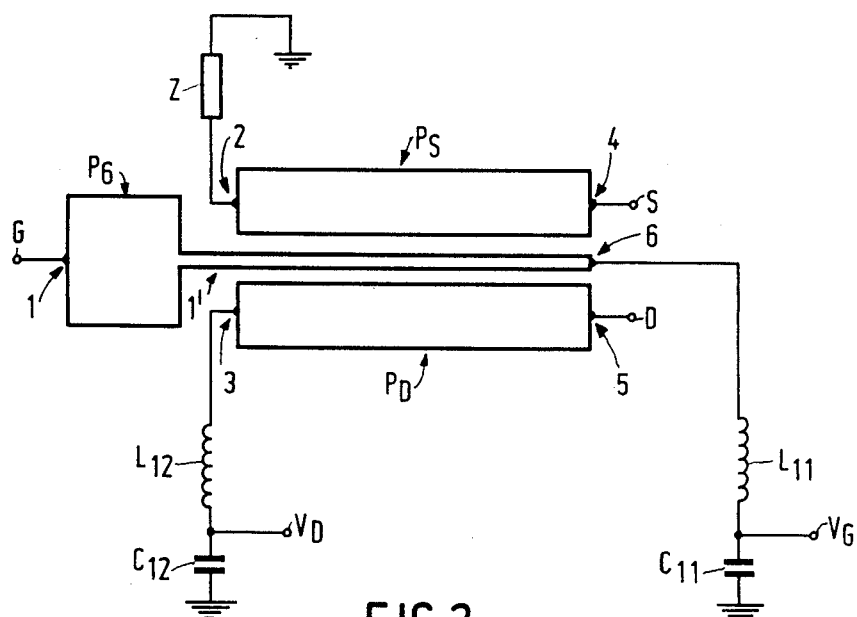
FIG. 2 is a plan view of an amplifier stage according to the invention, comprising a field-effect transistor having one gate finger.

For operation at lower frequencies, it is alternatively possible to use a transistor having one gate finger, for example the transistor shown in FIG. 2. The transistor of FIG. 2 comprises, formed on the active zone, a gate finger connected to an end 1' on a large-surface pad $P_G$ to which at 1 the high-frequency signal I is applied, and on both sides of the gate finger a source pad $P_S$ and a drain pad $P_D$ of elongate shapes arranged in parallel with the gate finger, between the points 2,4 and 3,5, respectively.

According to the invention, the gate is terminated at its end 6 opposite the pad $P_G$ by a circuit LC formed from $L_{11}$ and $C_{11}$, in a manner already described for the case of interdigital structures.

The high-frequency output signal O of the stage is taken off at the point 5 of the drain pad $P_D$ opposite the position of the gate pad $P_G$. The drain polarizing voltage is applied to the other end 3 of the drain pad $P_D$, via a circuit LC comprising $L_{12}$ and $C_{12}$, as described already for the interdigital structure.

The high-frequency source signal can be taken off from the point 4 of the source pad $P_S$ opposite the position of the gate pad $P_G$. A load Z of the same type as already described for the interdigital structures may be applied to the point 2 of the pad $P_S$, and be furthermore connected to ground.

Figure 3C:
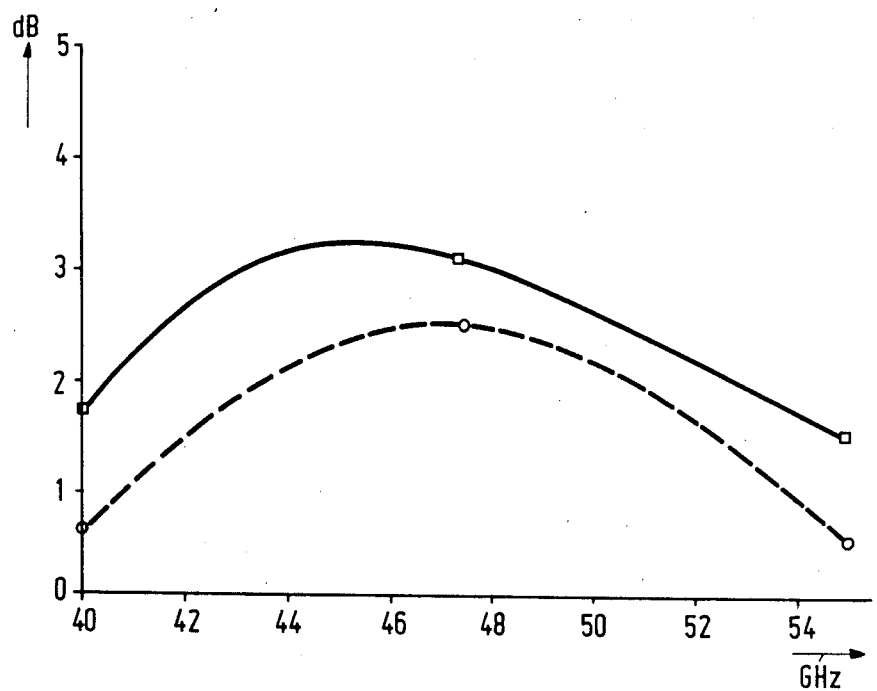
FIG. 3c shows, by means of a solid line, the gain of an amplifier as shown in FIG. 3b, and by means of a broken line the gain of an amplifier according to the prior art, versus frequency.
Figure 3A:
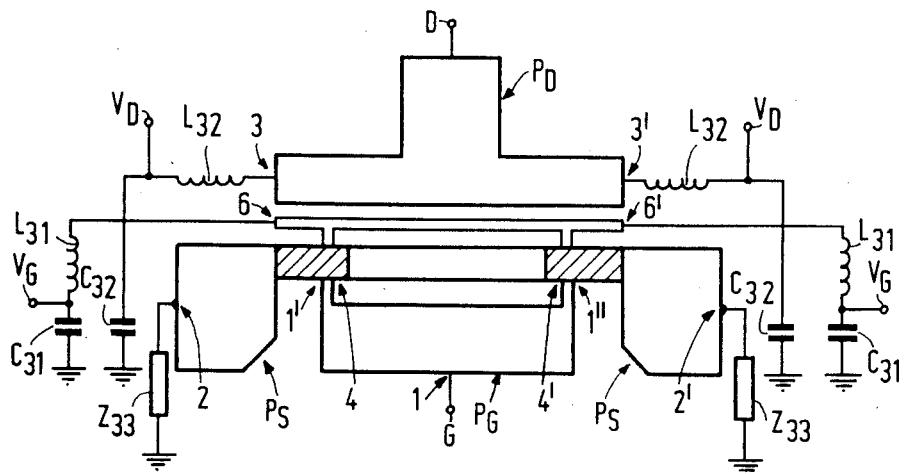
FIG. 3a showns a variation of the amplifier stage according to the invention.

In a variant of the arrangement according to the invention, shown in FIG. 3a, the transistor includes, formed on the active zone, an elongated drain electrode provided between the points 3 and 3', and connected in its midway point to a large-surface pad $P_D$ from which the high-frequency output signal O of the stage is taken; a gate electrode in the form of a finger which extends parallel to the drain between the points 6 and 6', and is connected symmetrically to the points 1' and 1" in a large-surface gate contact pad $P_G$ to which the high-frequency input signal I is applied in the point 1; and a source electrode which extends parallel to the gate and at the side opposite the drain, between the points 4 and 4' each of these points being connected symmetrically to a source pad $P_S$.

For such an arrangement, the means of the invention can be put into effect by providing a drain biasing circuit $L_{32}$, $C_{32}$ at the ends 3 and 3' of the drain electrode, the d.c. drain biasing voltage $V_D$ being applied to the junction point of the inductance $L_{32}$ and the capacitor $C_{32}$; by providing a gate biasing circuit $L_{31}$, $C_{31}$ at the ends 6 and 6' of the gate electrode, the d.c. source biasing voltage $V_G$ being applied to the junction point of the inductance $L_{31}$ and the capacitor $C_{31}$; and by connecting the source to ground via the loads $Z_{33}$ provided in the points 2 and 2'.

Figure 3B:
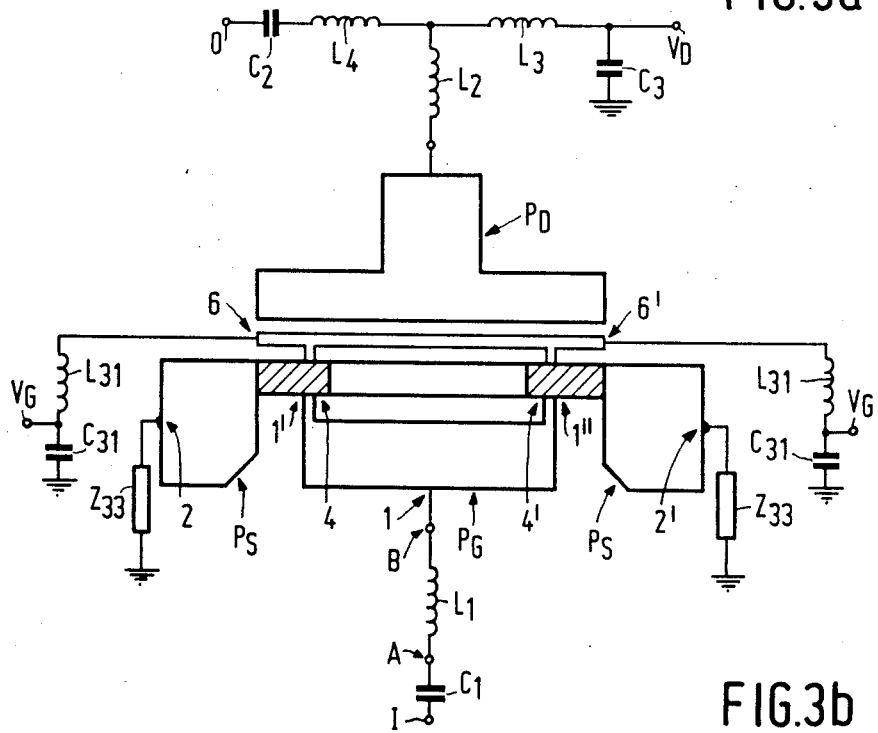
FIG. 3b shows an amplifier stage formed on the basis of a transistor of the type as shown in FIG. 3a, charged in accordance with the invention

In the arrangement shown in FIG. 3a, the inductance $L_{32}$ does not contribute towards an increase in the gain and can consequently be positioned either as shown in this Figure or in any manner known from the prior art. FIG. 3b shows an amplifier stage which is obtained by means of a transistor which is loaded in accordance with the invention, of the transistor type shown in FIG. 3a. This amplifier circuit is here only given as an example of an embodiment. The elements $L_1$, $L_2$, $L_3$, $L_4$ are transmission lines of the "micro-strip" type. The elements $C_1$, $C_2$, $C_3$, $C_{31}$ are decoupling capacitors. The element $L_{31}$ is a transmission line whose inductance has the inductance value defined in accordance with the invention. (see the relation 5 of the Table I).

In accordance with the prior art, it is known to connect in such an amplifier the elements $L_{31}$ and $C_{31}$ not to the points 6 and 6', but either to the point A or to the point B. Acting in this known manner, using component values listed in the Table III, the gain curve as a function of the frequency is obtained which is illustrated by a broken line in FIG. 3c. In contrast thereto, providing in accordance with the invention the elements $L_{32}$ and $C_{32}$ in the points 6 and 6', the gain curve shown by a solid line in FIG. 3c is obtained, while maintaining the same values for the different elements.

In a general manner, for all these assemblies, the invention provides the following advantages:

the maximum gain of the stage is increased over a wide-band of frequencies;

the cut-off frequency of the stage is no longer limited by the resistance losses of the gate;

the performance of the amplifiers are improved, more specifically for high frequencies;

the gate and drain biasing circuits are monolithically integrated with the transistor;

a better match between the input and the output of the transistor is realized;

the invention is not limited to the transistors described in the foregoing; it can also be used for transistors of different shapes realized by means of various technologies, such as MESFET or HEMT-type field-effect transistors, realized in hybrid technology or monolithically integrated.

The performance obtained with circuits according to the invention, as shown for example in the FIGS. 1a, 2 and 3a, depends on the values of the respective inductances $L_{21}$, $L_{11}$ and $L_{31}$.

If it is taken into consideration that the transistor has at its input a capacitor $C_e$ connected to a resistor $R_g$ which is the plating resistance of the gate electrode, the value of the inductance which is to be provided at the end opposite to the end to which the high-frequency signal is applied is given by the relation 5 of the Table I in which $\omega$ is the pulse rate of the high-frequency signal.

TABLE I $$K = (1 + |S_{11} S_{22} - S_{12} S_{21}|^2 - |S_{11}|^2 - |S_{22}|^2)/2|S_{12}| \cdot |S_{21}|. \quad (1)$$

$$MAG = K\phi \sqrt{K^2 - 1} \cdot \left| \frac{S_{21}}{S_{12}} \right| \quad (2)$$

$$MSG = \left| \frac{S_{21}}{S_{12}} \right| \quad (3)$$

$$Z = R + jY \quad (4)$$

$$L = \frac{1}{2} \left[ \frac{3}{c_e \omega^2} + \frac{1}{\omega} \left( \frac{9}{c_e^2 \omega^2} + R_g^2 \right)^{\frac{1}{2}} \right] \quad (5)$$

TABLE II

| | | |
|---|---|---|
| l | = | 0,5 μm on an average (0,2 μm ≦ l ≦ 2 μm) |
| L | = | 100 μm for each gate finger |
| $V_T$ | = | −3 V (transistor threshold voltage) |
| $I_{DS}$ | ≈ | 50 mA |

The biasing conditions were:

| | |
|---|---|
| $V_D \approx 3$ V | $V_G \approx -1$ V |
| $Z_{23} = Z'_{23} = 0$ | |
| $L_{22} = 0,5$ nH | $L_{21} = 2,5$ nH |
| $C_{22} = C_{21} = 15$ pF | |

TABLE III

| | |
|---|---|
| $L_1 = 0,15$ nH | $C_1 = C_2 = C_3 = C_{31} = 2$ pF |
| $L_2 = 0,12$ nH | |
| $L_3 = 0,2$ nH | $Z_{33} = 0,2 + jq$ (phms) |
| $L_4 = 0,04$ nH | |

What is claimed is:

1. A high-frequency circuit comprising at least a field-effect transistor having an active zone, gate, drain and source electrodes in contact with said active zone, the gate electrode receiving a high-frequency input signal in operation, the source and drain electrodes being provided with biasing and charging circuits, and the source electrode being connected to ground through a load, characterized in that high-frequency signals are present at a first end of said electrodes in operation, said electrodes being terminated at their second end by at least one of a biasing circuit and a charging circuit.

2. A circuit as claimed in claim 1, in which the field-effect transistor is formed by a gate electrode having a finger with the source and drain electrodes being provided on opposite sides of said finger, the gate electrode being connected by means of its first end to a large-surface contact pad, characterized in that the high-frequency input signal is applied to the gate pad and the second end of the gate finger is terminated by the biasing and gate charging circuit, in that the high-frequency output signals are taken from the ends of the source and drain electrodes which are longitudinally opposite to the position of the gate pad; and in that the second ends of said source and drain electrodes are terminated by a load which is connected to ground, and by the drain biasing and charging circuits, respectively.

3. A circuit as claimed in claim 1, in which the field-effect transistor is formed by said gate electrode having a plurality of N parallel-arranged fingers, said drain electrode having (N-1) parallel-arranged fingers, each drain finger being disposed between two gate fingers, and said source electrode comprising two contacts arranged on both sides of the gate-drain assembly, the first ends of the gate fingers being interconnected and connected to a large-surface contact pad, and the second ends of the drain fingers which are provided longitudinally opposite the gate contacts pad being interconnected and connected to a large-surface contact pad, characterized in that the high-frequency input signal is applied to the gate pad, and the second ends of the gate fingers are interconnected and terminated by the gate biasing and charging circuits, in that the high-frequency output signal of the drain is taken from the drain pad, and the second ends of the drain fingers are interconnected and terminated by the drain biasing and charging circuits, and in that the high-frequency output signal of the source is taken from a selected one of the source electrodes from its first end opposite the gate pad and the second ends of the source electrodes are interconnected and terminated by a load which is further connected to ground.

4. A circuit as claimed in claim 3, characterized in that the load applied to said second ends of the source electrodes is formed by two symmetrical loads.

5. A circuit as claimed in claim 1, in which the gate electrode has one finger, with the source electrode and the drain electrode being provided on opposite sides of said finger, the gate electrode being connected via each of its ends in a symmetrical manner to a large-surface pad, the source electrode being connected by means of each of its ends in a symmetrical manner to two large-surface pads, and the drain electrode being connected from its midway point to a large-surface pad, characterized in that the high-frequency input signal is applied to the gate pad, and in that the ends of the gate fingers are connected in a symmetrical manner to gate biasing and charging circuits, in that the high-frequency output signal is taken from the drain pad, and in that the ends of the source electrode are connected to ground via symmetrical loads.

6. A circuit as claimed in claim 5, characterized in that the drain biasing and charging circuits are provided at each end of the drain electrode.

7. A circuit as claimed in claim 5, characterized in that the drain biasing and charging circuits are provided on the drain pad.

8. A circuit as claimed in claim 1, characterized in that the gate and drain biasing and charging circuits are each constituted by an inductance which is connected to ground via a d.c. insulating capacitor, and in that a d.c. biasing circuit for the gate and the drain, respectively, is applied to the junction point of the inductance and the capacitor.

9. A circuit as claimed in claim 8, characterized in that in the gate biasing and charging circuits this inductance L has a value of about $$L = \frac{1}{2}\left[\frac{3}{c_e\omega^2} + \frac{1}{\omega}\left(\frac{9}{c_e^2\omega^2} + R_g^2\right)^{\frac{1}{2}}\right]$$

in which $C_e$ is the input capacitance of the transistor, $R_g$ is the plating resistance of the gate and $\omega$ is the pulse rate of the high-frequency signal.

* * * * *